United States Patent [19]

Wechsler

[11] Patent Number: 4,995,105
[45] Date of Patent: Feb. 19, 1991

[54] ADAPTIVE LASER DIODE DRIVER CIRCUIT FOR LASER SCANNERS

[75] Inventor: Erwin R. Wechsler, La Crescenta, Calif.

[73] Assignee: Xerox Corporation, Stamford, Conn.

[21] Appl. No.: 408,823

[22] Filed: Sep. 18, 1989

[51] Int. Cl.$^5$ .............................................. H01S 3/13
[52] U.S. Cl. ....................................... 372/38; 372/29; 372/24; 372/26
[58] Field of Search ......................... 372/29, 38, 26, 24

[56] References Cited

U.S. PATENT DOCUMENTS

| | | | |
|---|---|---|---|
| 4,577,320 | 3/1986 | Yoshikawa et al. | 373/29 |
| 4,698,817 | 10/1987 | Burley | 372/38 |
| 4,796,266 | 1/1989 | Banwell et al. | 372/38 |
| 4,813,034 | 3/1989 | Mashimo | 372/29 |

Primary Examiner—Léon Scott, Jr.
Attorney, Agent, or Firm—Robert E. Cunha

[57] ABSTRACT

A circuit used in laser scanners which allows the continuous calibration of a laser so that the output power of the laser is accurately modulated by the input video signal regardless of temperature changes or aging effects of the laser. The video signal includes a test segment which has two steps. The light output of the laser is measured during both steps. The lower step measurement is compared to a reference and the error is used to adjust the bias current of the laser. The difference between the upper step measurement and the lower step measurement is compared to a second reference and the error is used to adjust the gain of the video signal so that the variation in laser power maximum and minimum remains calibrated.

2 Claims, 3 Drawing Sheets

ADAPTIVE LASER DIODE DRIVER CIRCUIT FOR LASER SCANNERS

BACKGROUND OF THE INVENTION

The invention is a laser-diode driver circuit which adapts its parameters so that the output light power of the laser follows accurately the imput video-signal voltage applied to the circuit. Lasers used in printing systems (Xerograpic, film etc.) are modulated during the scanning of a photosensitive medium by the laser beam. The simplest kind of modulation is the binary mode where the laser is turned on and off to produce dots of equal intensity.

More sophisticated printing methods require shades of gray. Amplitude modulating the light output of a laser diode presents some difficulties because the light power versus the drive current characteristics of the laser change due to temperature and aging.

The effect of aging on a laser being used in a gray scale mode can be corrected for, by periodic calibration, while slow variations in ambient temperature can be cancelled by mounting the laser in a temperature-controlled enclosure. Both solutions are expensive and the latter one can not cancel faster thermal effects due to laser self heating which is dependent on the data being printed.

A more effective solution is to drive the laser diode with an adaptive circuit which updates its calibration every scan line.

One method of such calibration of a laser diode is described in: Apparatus for Stabilizing the Optical Output Power of a Semiconductor Laser by Shibagaki et al. U.S. Pat. No. 4,733,398. That method concerns the generation of stabilized light pulses of equal intensity only. The invention described herein updates the calibration circuit at the beginning (or end) of every scan line in a time interval when the laser is turned on for start (or end) of scan detection and then allows the laser to be accurately modulated during the scan line by the input video voltage applied to the laser driver circuit.

SUMMARY OF THE INVENTION

This invention is a circuit which improves on the prior art by allowing a laser diode to be accurately amplitude modulated by an input video voltage while changes in the laser characteristics due to temperature and aging are being compensated for. The circuit measures the output power of the laser at two points on the power versus current curve. The lower power measurement is compared to a present value and the error is integrated by an integrator whose output determines the bias current of the laser. The difference between the upper power measurement and the lower one is compared to a second present value and the error is integrated by a second integrator whose output determines the gain of the video signal by controlling an analog multiplier.

DETAILED DESCRIPTION OF THE INVENTION

Figure 1:
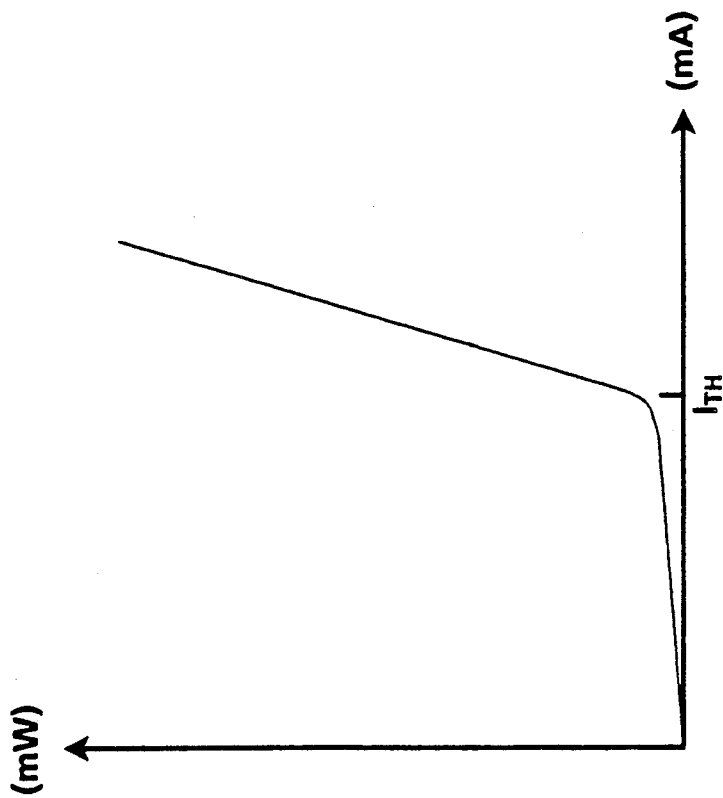
FIG. 1 is a typical graph of the laser output power against input current.

Laser diodes have a power output vs input current characteristic similar to the curve of FIG. 1. When the drive current is less than the threshold current $l_{th}$, the laser behaves like a light emitting diode and the output is incoherent light. At $l_{th}$ the curve has a knee and the laser starts to emit coherent light. For currents larger than $l_{th}$ the curve becomes fairly linear.

Figure 2:
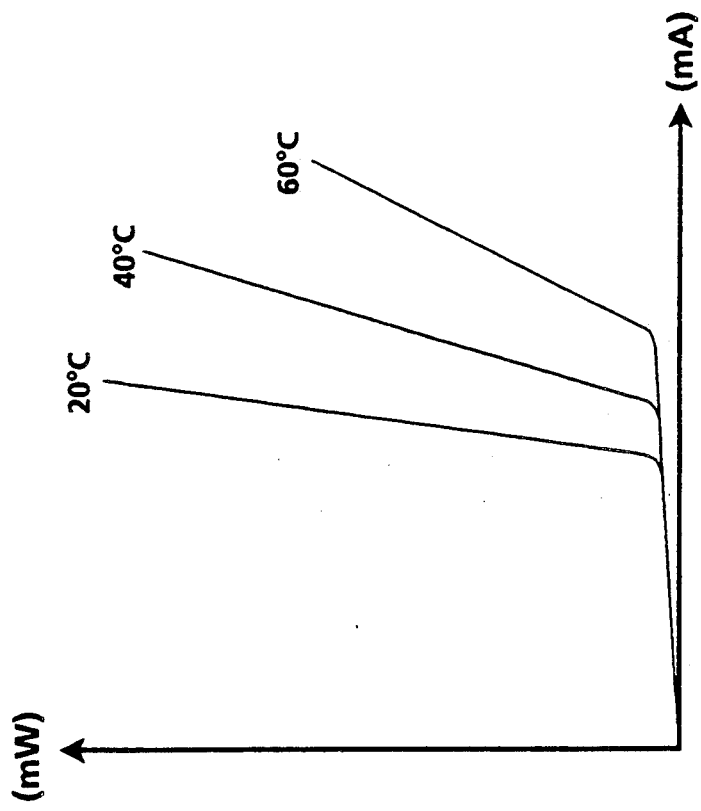
FIG. 2 is graph of the effect of temperature on the output power.

As the temperature changes and as the laser ages, the power vs current curve also changes. For example, the threshold current increases and the slope of the curve decreases with temperature as shown in FIG. 2.

Figure 3:
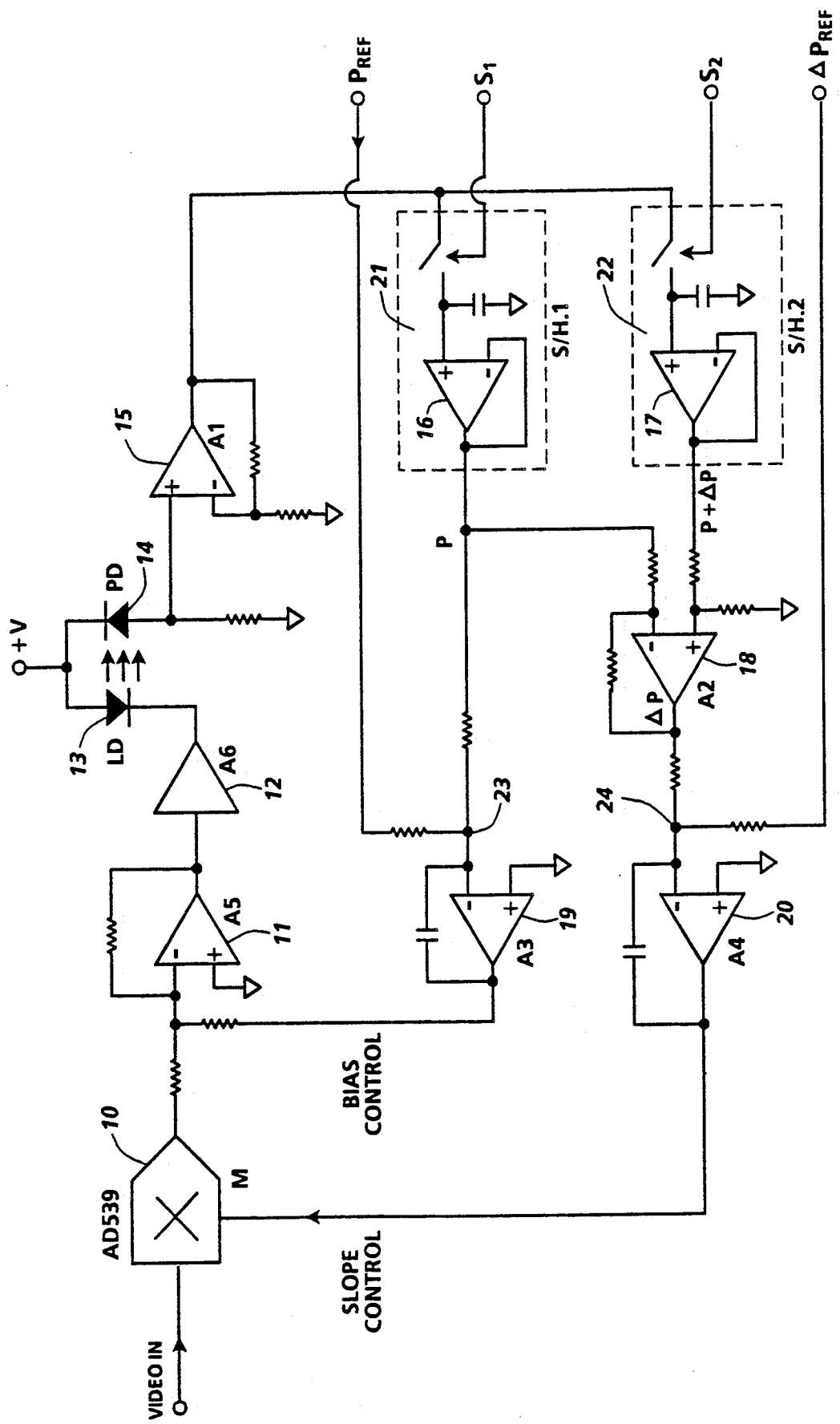
FIG. 3 is a schematic diagram of the circuit.

The operation of the control circuit to calibrate the laser output can be decribed with reference to FIG. 3. The analog video input voltage is applied to the input of multiplier 10 which amplifies the voltage, inverter 11 and amplifier 12 for application to the laser diode 13. The light output is monitored by the photo diode 14, the output of which is amplified by amplifier 15 for application to the two sample-and-hold circuits 21, 22.

At the time of a first, low level calibration step the first sample-and-hold circuit 21 captures the instantaneous output of amplifier 15. The difference between this voltage and the first reference Pref is integrated by amplifier 19, the output of which either increases or decreases slowly as a result. The output of this integrator is used as the bias control, and is applied to inverter 11 to set the amount of current at the minimum level of laser output power.

At the time of a second, high level calibration step, the second sample-and-hold circuit 22 captures the instantaneous output of amplifier 15 and couples it to differential amplifier 18, the output of which is a voltage corresponding to the difference in power between the low and high output levels of the laser. This difference is compared to a reference signal Δ Pref by integrater 20. The output of this stage is used to set the multiplication of the multiplier 10. A commercial part, Number AD539, made by Analog Devices was used.

Figure 4:
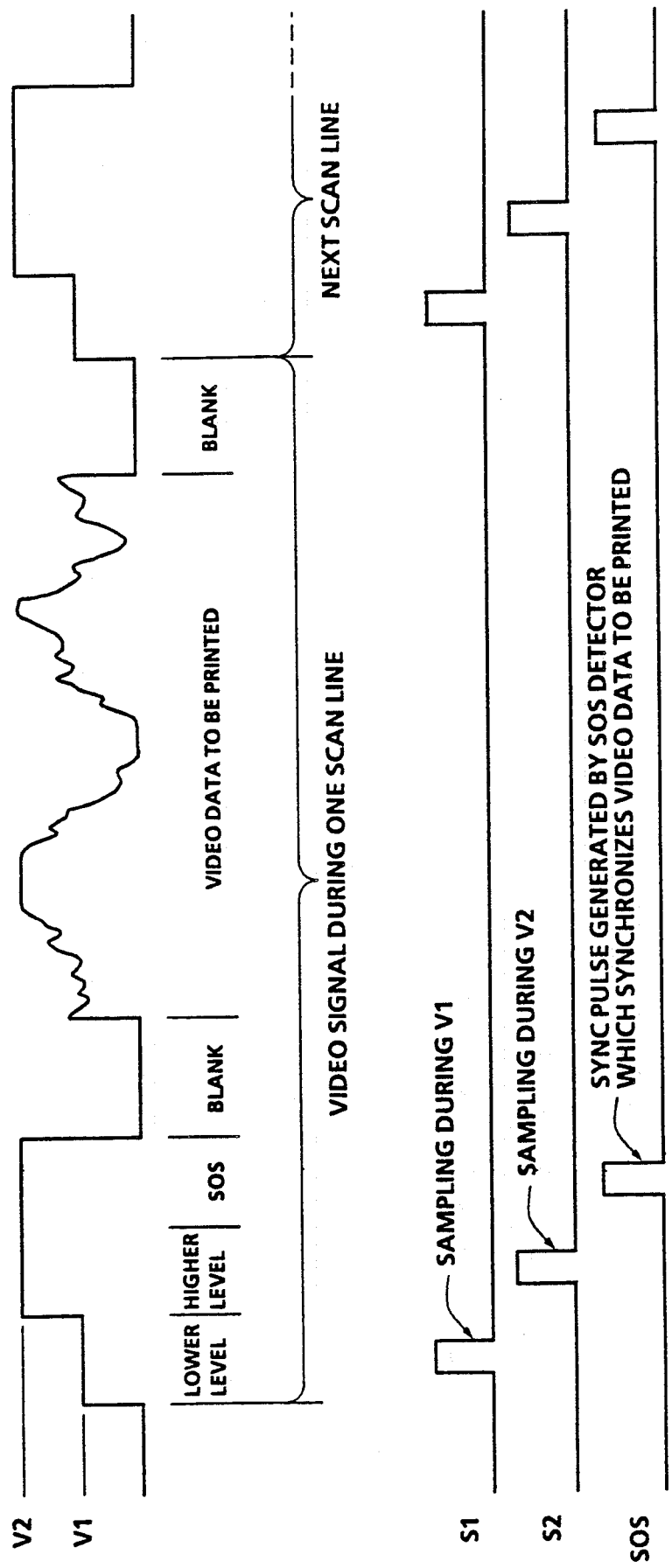
FIG. 4 is a timing diagram of several circuit waveshapes.

The waveshapes used to drive this circuit are shown FIG. 4. Waveshape S1 is applied to sample-and-hold circuit 21 to enable it while a low level V1 is applied to the video input of the circuit to set the bias level. Waveshape S2 is applied to a sample-and-hold circuit 22 to enable it while a high level V2 is applied to the video input of the circuit to set the slope of the curve. The start of scan pulse, which signifies the start of the scan across the output page, starts after the calibration is finished so that the calibration signal does not show up as marks on the output hard copy.

FIG. 4 shows a typical video signal during a scan line. The video signal takes the two values needed for calibration V1 and V2 which make a two step staircase segment. The video signal remains at the high value after the calibration measurements are made, for a brief time period necessary for the beam to cross the Start of Scan Detecter used in laser scanners for synchronizing the video signal with the start of each scan line. After the laser beam has crossed the Start-of-Scan Detecter the laser is turned off (blanked) so that the edge of the photoreceptor will not be exposed to light before the data to be printed is transmitted to the laser. Following the data transmission the laser is blanked again and a new scan line begins.

In operation, this calibration occurs during the warm up process immediately after the printer is turned on so that laser will be calibrated as soon as it is ready to be used, and the calibration continues to be done immediately before (or after) each scan line so that the effects of transient thermal variations will be automatically and promptly eliminated.

While the invention has been described with reference to a specific embodiment, it will be understood by those skilled in the art that various changes may be made and equivalents may be substituted for elements thereof without departing from the true spirit and scope of the invention. In addition, many modifications may be made without departing from the essential teachings of the invention.

What is claimed is:

1. The process of calibrating the light output of a laser diode, the output amplitude of which is controlled by a bias level, used in a raster scanning system for generating a scan comprising a laser driver circuit having an adjustable gain and a video input signal applied to said laser driver circuit before the scan begins or after the scan ends in a time interval where the laser is turned on for start of scan (or end of scan) detection comprising the steps of:

first applying a first preset video signal voltage to said laser driver circuit,
   first measuring the laser output generated by said first applying,
   storing the value of first said measuring,
   second applying a second preset video signal voltage to said laser driver circuit,
   second measuring the laser power generated by said second applying,
   storing the value of second said measuring,
   comparing one of the said measured power values to a first reference value to generate a first error,
   using said first error to adjust the bias level of the laser until said first error becomes zero,
   calculating the difference between the value of said first measuring and the value of said second measuring,
   comparing said difference to a second reference value to generate a second error, and
   using said second error to adjust the gain of the video signal until the said second error becomes zero.

2. A circuit for adjusting the bias level and the gain of the video signal applied to a laser diode the power output of which is controlled by an input drive current comprising:

means for generating an input test video signal comprising two preset levels of video signal voltage,
   means for changing gain of said video voltage, for adjusting the bias level of said laser and for applying said video signal and bias level to said laser by varying drive current,
   means for measuring the power output of said laser during application of said test video signal,
   means for storing said measured laser power values during application of said preset video signal voltage values,
   means for comparing one of said measured power values to a first reference to generate a first error,
   said means for adjusting bias level of laser being responsive to said first error such that bias levels adjusted until said first error becomes zero,
   means for performing the difference between the said first measurement and the said second measurement, and
   means for comparing said difference to a second reference value and generating a second error, and wherein
   said means to change gain of video signal to be responsive to said second error such that the gain of video signal is adjusted until said second error becomes zero.

* * * * *